(12) United States Patent
Watanabe et al.

(10) Patent No.: US 11,062,063 B2
(45) Date of Patent: Jul. 13, 2021

(54) SYSTEM AND METHOD FOR GENERATING VEHICLE TRAVEL DATA

(71) Applicant: International Business Machines Corporation, Armonk, NY (US)

(72) Inventors: Shoichiro Watanabe, Tokyo (JP); Mari A. Fukuda, Tokyo (JP); Yasutaka Nishimura, Yamato (JP); Asuka Unno, Tokyo (JP); Satoshi Hosokawa, Kodaira-chi (JP)

(73) Assignee: International Business Machines Corporation, Armonk, NY (US)

(*) Notice: Subject to any disclaimer, the term of this patent is extended or adjusted under 35 U.S.C. 154(b) by 496 days.

(21) Appl. No.: 15/948,300

(22) Filed: Apr. 9, 2018

(65) Prior Publication Data

US 2019/0311077 A1    Oct. 10, 2019

(51) Int. Cl.
*G06F 30/20* (2020.01)

(52) U.S. Cl.
CPC .................................. *G06F 30/20* (2020.01)

(58) Field of Classification Search
CPC .......... G06F 30/20; G06F 30/25; G06F 30/27; G06F 30/28
See application file for complete search history.

(56) References Cited

U.S. PATENT DOCUMENTS

| | | | | |
|---|---|---|---|---|
| 8,718,927 B2* | 5/2014 | Kitchel | ................... | G01C 21/32 701/412 |
| 10,037,689 B2* | 7/2018 | Taylor | .............. | G08G 1/096775 |
| 2011/0099171 A1* | 4/2011 | Van Buer | ................ | G01C 21/32 707/737 |
| 2011/0121992 A1* | 5/2011 | Konaka | ................... | G08G 1/166 340/905 |
| 2012/0277993 A1* | 11/2012 | Mund | ................... | G09B 29/106 701/450 |
| 2013/0204528 A1* | 8/2013 | Okude | ................ | G01C 21/3492 701/533 |
| 2015/0094945 A1* | 4/2015 | Cheng | ................ | G01C 21/3461 701/408 |
| 2015/0292892 A1* | 10/2015 | Claes | ................ | G01C 21/3492 701/533 |
| 2015/0360610 A1* | 12/2015 | Reed | ................. | B60W 50/0098 340/425.5 |

(Continued)

*Primary Examiner* — Chuen-Meei Gan
(74) *Attorney, Agent, or Firm* — William H. Hartwell; Madeline F. Schiesser; Keohane & D'Alessandro, PLLC

(57) ABSTRACT

Disclosed embodiments provide techniques for generation of vehicle travel data. Past-travel data including previously taken trips, along with metadata including, but not limited to, vehicle type, vehicle model, navigation device model, are obtained and classified. A travel route for simulation data is selected. Data from various previous trips are combined to create a simulation data set for the travel route. This data is based on actual vehicle data. This can enable a new level of accuracy for data analysis and simulations based on this data as compared with purely simulated data. Actual vehicle data accounts for driver behavior, road obstacles, signage, vegetation, vehicle characteristics, and other factors that may not be able to be captured with purely simulated traffic data. Using the data generated by disclosed embodiments enables these factors to be considered in traffic analysis.

15 Claims, 16 Drawing Sheets

(56) References Cited

U.S. PATENT DOCUMENTS

| | | | |
|---|---|---|---|
| 2015/0369836 A1* | 12/2015 | Cordova | G01C 21/16 |
| | | | 702/141 |
| 2016/0297456 A1* | 10/2016 | Nameki | B61L 3/004 |
| 2016/0334225 A1* | 11/2016 | Davidson | G09B 29/004 |
| 2017/0240185 A1* | 8/2017 | Li | B60W 40/08 |
| 2017/0262790 A1* | 9/2017 | Khasis | G08G 1/012 |
| 2018/0059687 A1* | 3/2018 | Hayes | G01C 21/343 |
| 2018/0094943 A1* | 4/2018 | Grochocki, Jr. | G01C 21/3484 |

\* cited by examiner

SYSTEM AND METHOD FOR GENERATING VEHICLE TRAVEL DATA

FIELD OF THE INVENTION

The present invention relates generally to transportation planning and more particularly, to a system and method for generating vehicle travel data.

BACKGROUND

To address social needs for transportation engineering and travel studies, large amounts of vehicle travel data are needed for performing simulation and analysis of various transportation and traffic situations. The quality and quantity of input data affects the results of such simulations and analysis. It is therefore desirable to have improvements in the generation of vehicle travel data.

SUMMARY

In one embodiment, there is provided a computer-implemented method for generating travel data for simulation of a travel route, comprising the steps of: obtaining past-travel data of vehicles; classifying the past-travel data into a plurality of travel fragments; performing segmentation on the travel route to obtain a plurality of route segments corresponding to the travel route; identifying matched travel fragments from the plurality of travel fragments; identifying unmatched segments from the plurality of route segments; identifying proxy travel fragments that correspond to one or more of the identified unmatched segments; and combining the matched travel fragments and the proxy travel fragments to create a simulation data set for the travel route.

In another embodiment, there is provided an electronic computing device comprising: a processor; a memory coupled to the processor, the memory containing instructions, that when executed by the processor, perform the steps of: obtaining past-travel data of vehicles; classifying the past-travel data into a plurality of travel fragments; performing segmentation on the travel route to obtain a plurality of route segments corresponding to a travel route; identifying matched travel fragments from the plurality of travel fragments; identifying unmatched segments from the plurality of route segments; identifying proxy travel fragments that correspond to one or more of the identified unmatched segments; and combining the matched travel fragments and the proxy travel fragments to create a simulation data set for the travel route.

In yet another embodiment, there is provided a computer program product for an electronic computing device comprising a computer readable storage medium having program instructions embodied therewith, the program instructions executable by a processor to cause the electronic computing device to: obtain past-travel data of vehicles; classify the past-travel data into a plurality of travel fragments; perform segmentation on the travel route to obtain a plurality of route segments corresponding to a travel route; identify matched travel fragments from the plurality of travel fragments; identify unmatched segments from the plurality of route segments; identify proxy travel fragments that correspond to one or more of the identified unmatched segments; and combine the matched travel fragments and the proxy travel fragments to create a simulation data set for the travel route.

BRIEF DESCRIPTION OF THE DRAWINGS

Features of the disclosed embodiments will be more readily understood from the following detailed description of the various aspects of the invention taken in conjunction with the accompanying drawings.

Figure 1:
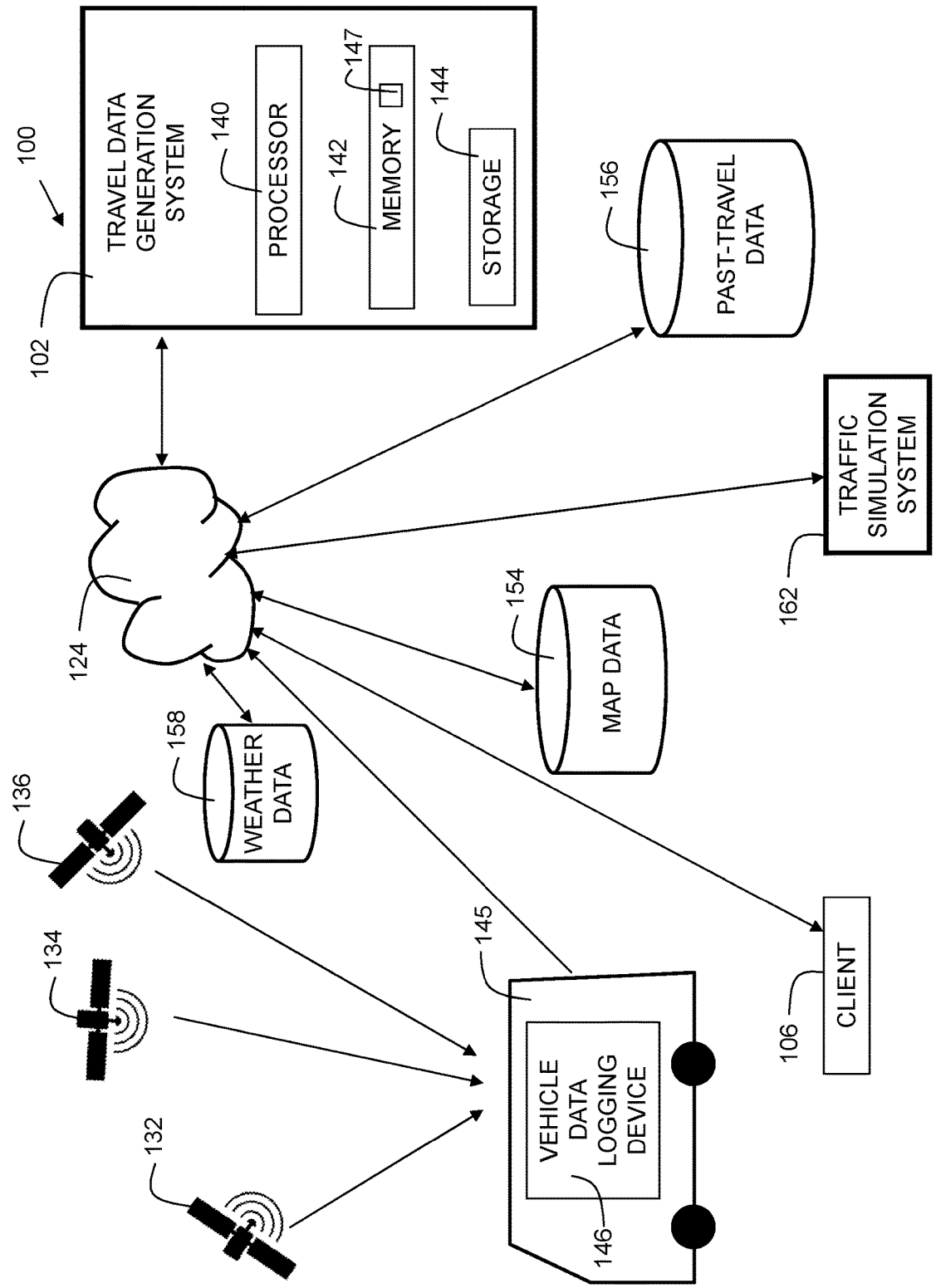
FIG. 1 is a diagram for an environment of embodiments of the present invention.

The drawings are not necessarily to scale. The drawings are merely representations, not necessarily intended to portray specific parameters of the invention. The drawings are intended to depict only example embodiments of the invention, and therefore should not be considered as limiting in scope. In the drawings, like numbering may represent like elements. Furthermore, certain elements in some of the figures may be omitted, or illustrated not-to-scale, for illustrative clarity.

DETAILED DESCRIPTION

Disclosed embodiments provide techniques for generation of vehicle travel data. Past-travel data including previously taken trips, along with metadata including, but not limited to, vehicle type, vehicle model, navigation device model, are obtained and classified. A travel route for simulation data is selected. The travel route is divided into multiple segments, such as for each intersection along the route. Data from multiple previously taken trips that share some portion of their route with the travel route are identified. This is referred to as past-travel data. Portions of the previously taken trips that align with segments of the travel route are identified. These portions are referred to as matched travel fragments. Segments of the travel route for which no previously taken trip exists are also identified. These are referred to as unmatched segments. For each unmatched segment, a nearby intersection and/or portion of road is identified from a previously taken trip, and data from that portion is applied to the travel route. This portion of data is referred to as a proxy travel fragment. The matched travel fragments and proxy travel fragments are combined to create a simulation data set for the travel route. This data is based on actual vehicle data, and not generically simulated data. This can enable a new level of accuracy for data analysis and simulations based on this data. Actual vehicle data accounts for driver behavior, road obstacles, signage, vegetation, vehicle characteristics, and other factors that may not be able to be captured with purely simulated traffic data. Using the data generated by disclosed embodiments enables these factors to be considered in traffic analysis.

Reference throughout this specification to "one embodiment," "an embodiment," "some embodiments", or similar language means that a particular feature, structure, or characteristic described in connection with the embodiment is included in at least one embodiment of the present invention. Thus, appearances of the phrases "in one embodiment," "in an embodiment," "in some embodiments", and similar language throughout this specification may, but do not necessarily, all refer to the same embodiment.

Moreover, the described features, structures, or characteristics of the invention may be combined in any suitable manner in one or more embodiments. It will be apparent to those skilled in the art that various modifications and variations can be made to the present invention without departing from the spirit and scope and purpose of the invention. Thus, it is intended that the present invention cover the modifications and variations of this invention provided they come within the scope of the appended claims and their equivalents. Reference will now be made in detail to the preferred embodiments of the invention.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", or "has" and/or "having", when used in this specification, specify the presence of stated features, regions, integers, steps, operations, elements, and/or components, but do not preclude the presence or addition of one or more other features, regions, or elements.

Planning, building, modifying roads, etc. requires a substantial amount of data to be done in the most efficient and effective manner. To assist in the process, traffic simulations are produced. These simulations enable the assessment of infrastructure modifications and policy changes prior to implementing them in real life. As an example, a simulation may facilitate determining the most efficient placement and timing of traffic control signals. A simulation may also facilitate the dangers or benefits of a stop sign in a particular intersection.

FIG. 1 is a diagram 100 for an environment of embodiments of the present invention. Travel data generation system 102 includes a processor 140, memory 142, and storage 144. Memory 142 includes instructions 147, which when executed by the processor, causes system 102 to implement the elements of the invention. System 102 receives data, and creates simulated traffic patterns based at least in part, on the received data.

Vehicle 145 is in communication with system 102 via network 124, which may be the Internet, a local area network, a wide area network, or other suitable network. Vehicle 145 may be an automobile, such as a car, motorcycle, or truck. The vehicle has a vehicle data logging device 146. This may include a GPS receiver, GLONASS, Galileo, or other suitable geolocation system. Device 146 is connected to network 124, and is also in communication with geolocation system satellites 132, 134, and 136. Note that while three satellites are illustrated in FIG. 1, in practice, a geolocation system can have many more satellites, and the geolocation receiver may be in simultaneous communication with more than three satellites during operation.

The environment may include databases. Database 154 stores map data (i.e., information about geography, roads, paths, etc.). Database 156 stores data about past-travel routes. These are routes which a user has traveled in the past, and for which past-travel data from a vehicle data logging device exists. Weather database 158 stores historical weather conditions for areas covered by the past-travel data. This can be used to associate weather conditions with the past-travel data, which can be useful for certain types of traffic studies (e.g. studying the behavior of drivers and/or traffic patterns during heavy rain).

Client device 106 is connected to network 124. Client device 124 may be a desktop computer, laptop computer, tablet, smartphone, PDA, or other suitable electronic computing device. A user may interact with system 102 via device 106.

Traffic simulation system 162 includes data used for different routes for composite routes. This takes as input, traffic data collected and created at system 102. System 162 uses the traffic data to simulate an effect of implementing a change in traffic, road, and/or weather conditions. For example, system 162 may analyze a simulated traffic pattern created by system 102, and determine that a stop light algorithm that goes red for more than 45 seconds at a particular intersection would cause an unsafe traffic backup at a nearby intersection.

Figure 2:
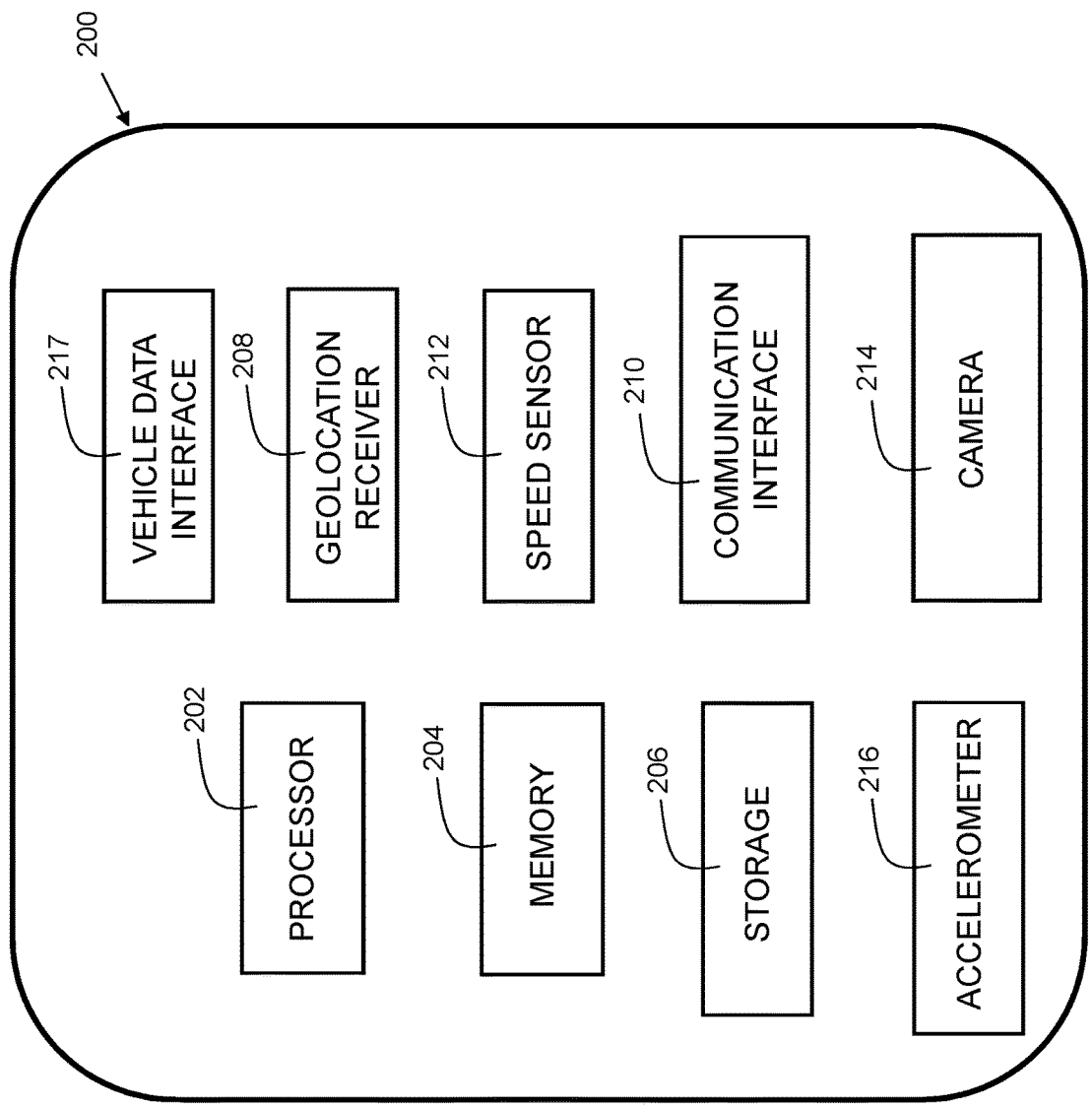
FIG. 2 is a block diagram of a vehicle data logging device used with embodiments of the present invention.

FIG. 2 is a block diagram of a vehicle data logging device used with embodiments of the present invention. Device 200 is an electronic computing device. Device 200 includes a processor 202, which is coupled to a memory 204. Memory 204 may include dynamic random access memory (DRAM), static random access memory (SRAM), magnetic storage, and/or a read only memory such as flash, EEPROM, optical storage, or other suitable memory. In some embodiments, the memory 204 may not be a transitory signal per se. Memory 204 stores instructions, which when executed by the processor, implement the steps of the present invention.

Device 200 may further include storage 206. In embodiments, storage 206 may include one or more magnetic storage devices such as hard disk drives (HDDs). Storage 206 may additionally include one or more solid state drives (SSDs).

Device 200 further includes geolocation receiver 208. This may operate with global positioning satellite systems, such as GPS, GLONASS, Galileo, or other suitable system.

The device 200 further includes a communication interface 210. The communication interface 210 may be a wired communication interface that includes Ethernet, Gigabit Ethernet, or the like. In embodiments, the communication interface 210 may include a wireless communication interface that includes modulators, demodulators, and antennas for a variety of wireless protocols including, but not limited to, Bluetooth™, Wi-Fi, and/or cellular communication protocols for communication over a computer network.

Device 200 further includes speed sensor 212. This senses the speed which the vehicle is traveling. A conventional vehicle speed sensor generates a magnetic pulse as a wave proportional to the speed of the vehicle. There are two types of speed sensors, namely, Hall Effect sensor or Reed switch-type. The operation of such speed sensors is known to those of skill in the art. In embodiments, speed sensor 212 may be any type of speed sensor now known or hereafter developed.

Device 200 may further include camera 214. The camera may be integral with the device as shown, or connected thereto via a wired or wireless connection.

The device 200 may further include an accelerometer 216. The accelerometer may be capacitive, piezoelectric resistive, capacitive spring mass system base, DC response, electromechanical servo based, high gravity, high temperature, a laser accelerometer, or other type now known or hereafter developed.

The device 200 may further include vehicle data interface 217. This can include an OBD II interface, enabling reception of various vehicle parameters such as engine operating parameters. The vehicle data interface 217 can additionally/alternatively include a CAN bus interface to receive messages from various vehicle microcontrollers to obtain information regarding braking, acceleration, steering, and/or other vehicle parameters.

Figure 3A:
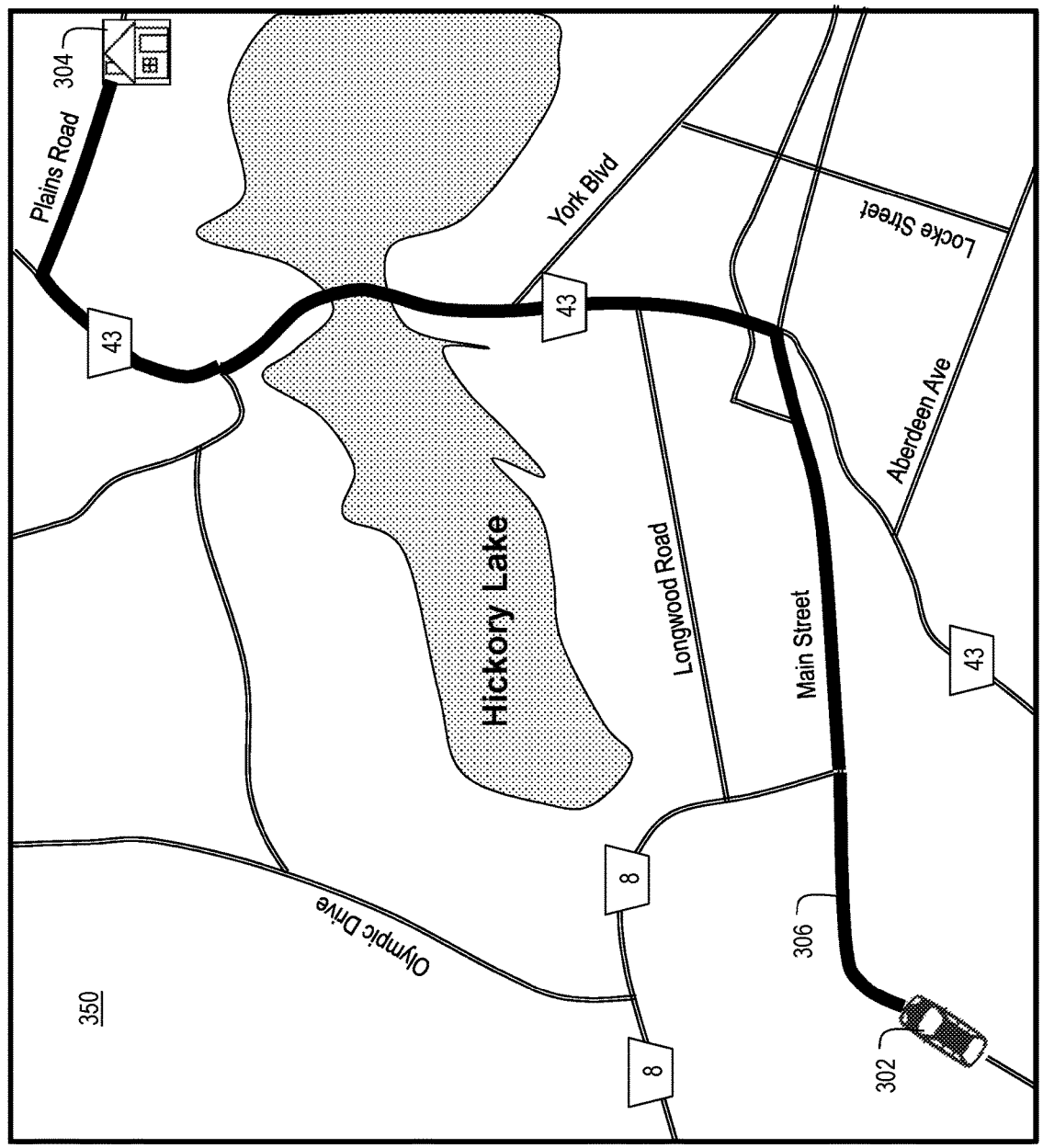
FIG. 3A shows an example travel route for simulation.

FIG. 3A shows an example travel route for simulation. Map 350 shows a representation of a geographic area. The area includes various roads and a lake. A vehicle 302 is shown travelling on the route indicated as 306, which starts on Main Street. A house 304 is shown on Plains Road.

Figure 3B:
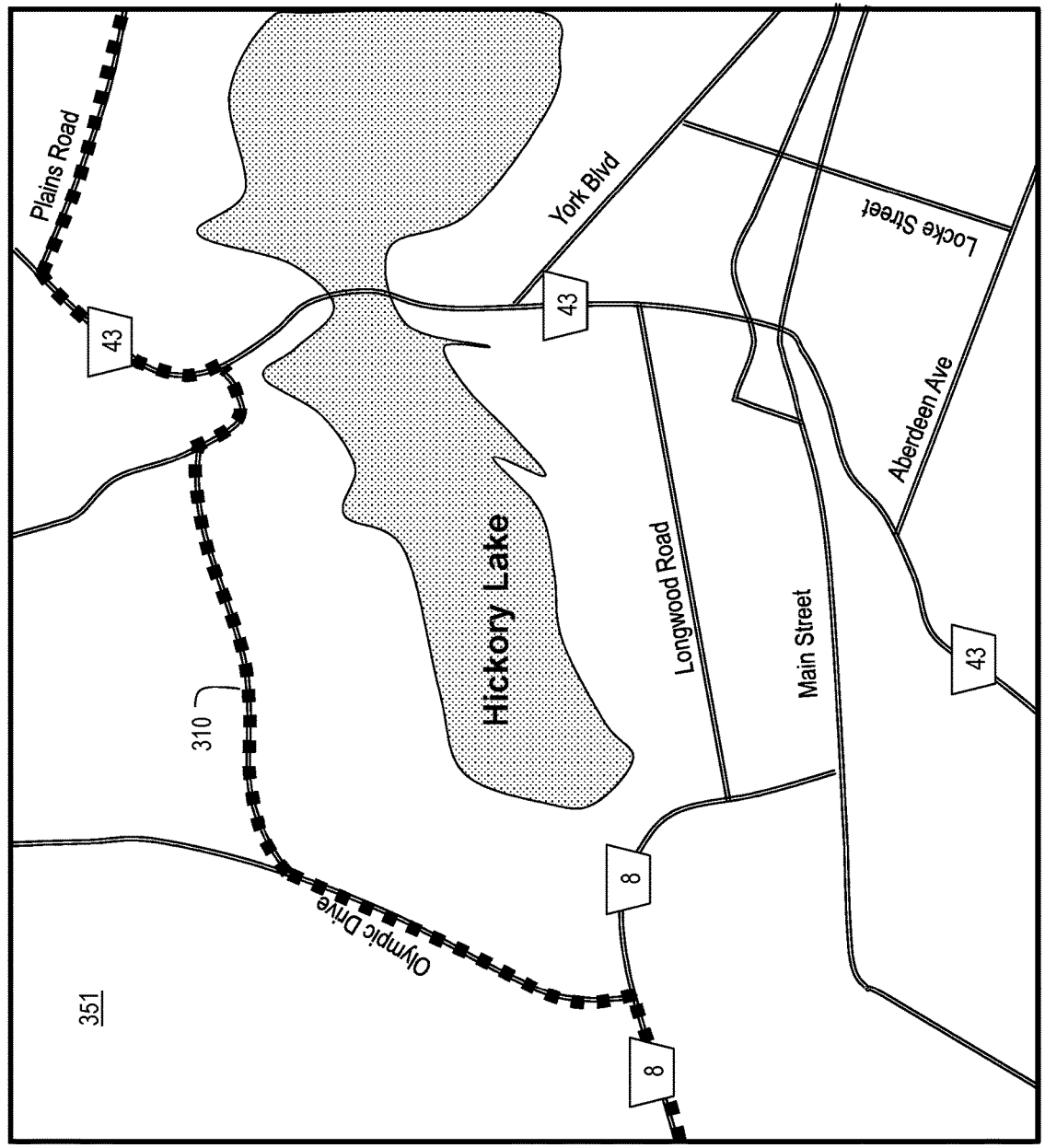
FIG. 3B shows a first past-travel data set.

FIG. 3B shows a first past-travel data set. Map 351 shows at dotted line 310 a travel route traversed by a vehicle in the past. The first past-travel data set is the data about this travel route. This travel route extends from Route 8 to Olympic Drive, Route 43, and to Plains Road.

Figure 3C:
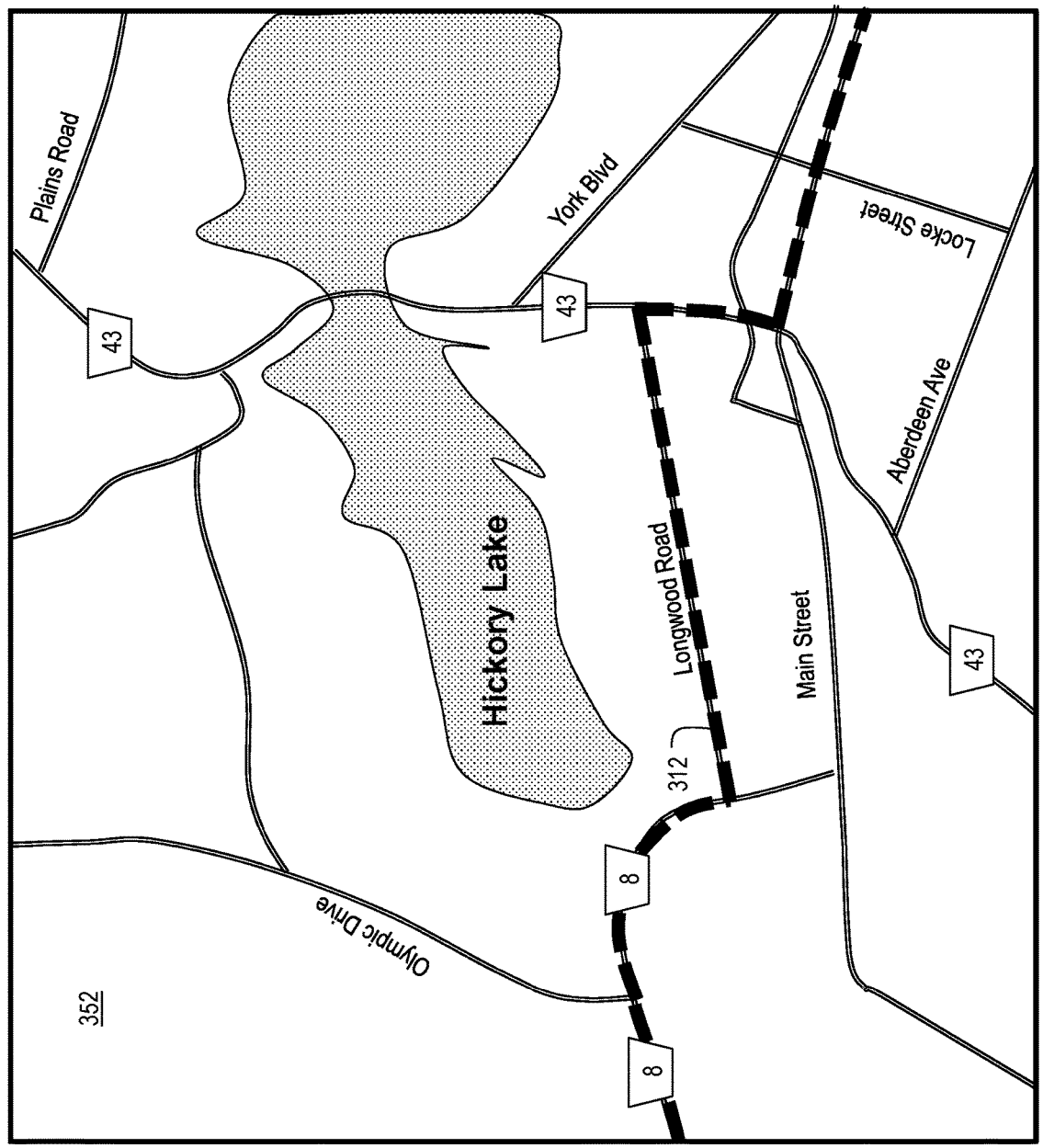
FIG. 3C shows a second past-travel data set.

FIG. 3C shows a second past-travel data set. Map 352 shows at dashed line 312 a travel route traversed by a vehicle in the past. The second past-travel data set is the data about this travel route. This travel route extends from Route 8 to Longwood Road, Route 43, and then to Main Street.

Figure 3D:
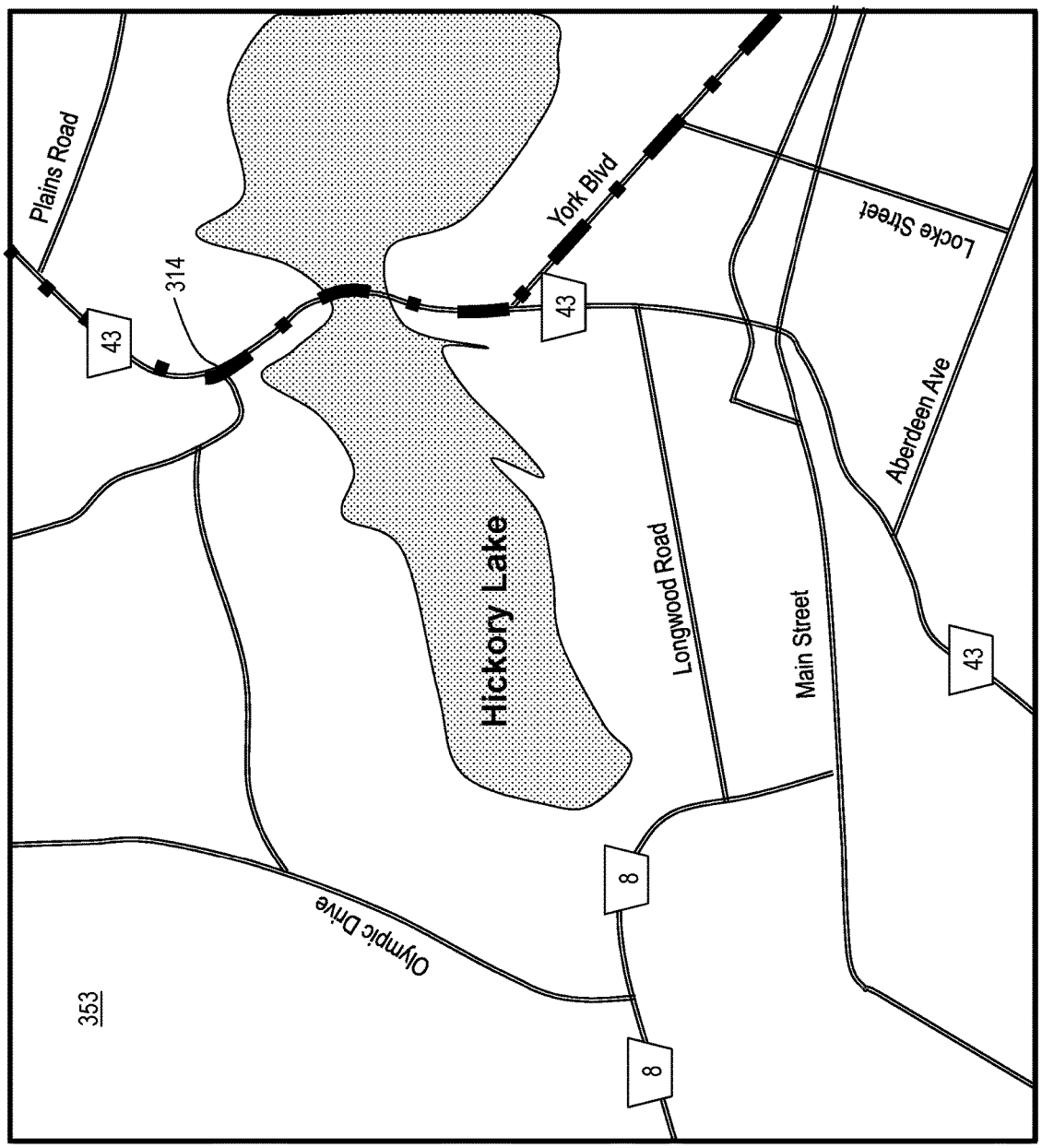
FIG. 3D shows a third past-travel data set.

FIG. 3D shows a third past-travel data set. Map 353 shows at dashed-dotted line 314 a travel route traversed by a vehicle in the past. The third past-travel data set is the data about this travel route. This travel route extends up York Blvd to Route 43. The data shown in the routes of FIG. 3B, FIG. 3C, and FIG. 3D represent data available from a vehicle data logging device such as vehicle data logging device 200 of FIG. 2.

Figure 3E:
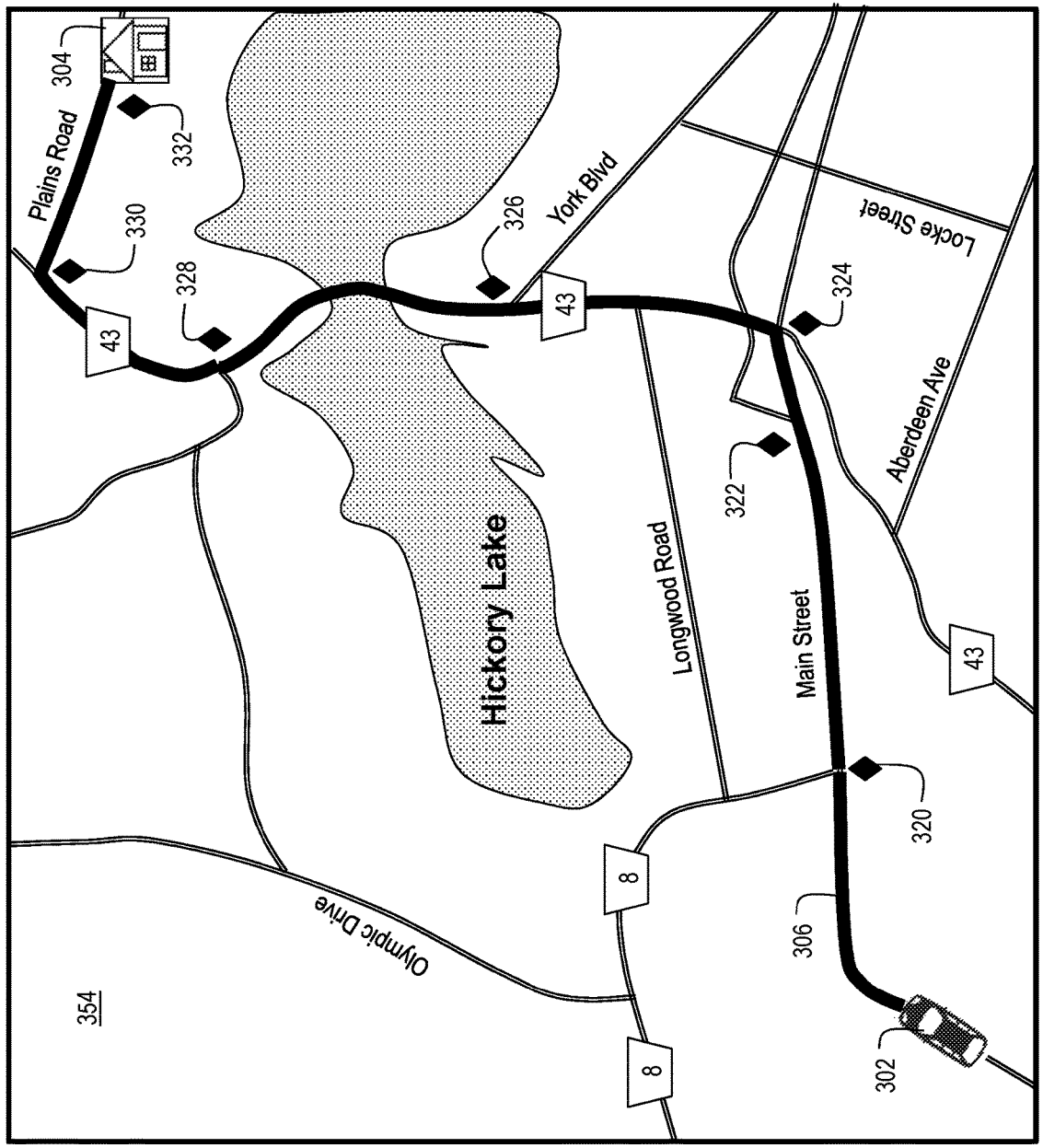
FIG. 3E shows a segmented travel route for simulation.

FIG. 3E shows a segmented travel route for simulation. Map 354 shows travel route 306, which runs from the location of vehicle 302, as shown, to house 304. In the example, this is the route which one desires to simulate. Diamonds next to the travel route indicate segment end points (i.e. separation of one segment from another). Segments may be created at major intersections, though other landmarks may be used instead in some embodiments. As shown, route 306 includes seven segments. A first segment is established from vehicle 302 to diamond 320. A second segment is established from diamond 320 to diamond 322. A third segment is established from diamond 322 to diamond 324. A fourth segment is established from diamond 324 to 326. A fifth segment is established from diamond 326 to diamond 328. A sixth segment is established from diamond 328 to diamond 330. A seventh segment is established from diamond 330 to diamond 332.

Figure 3F:
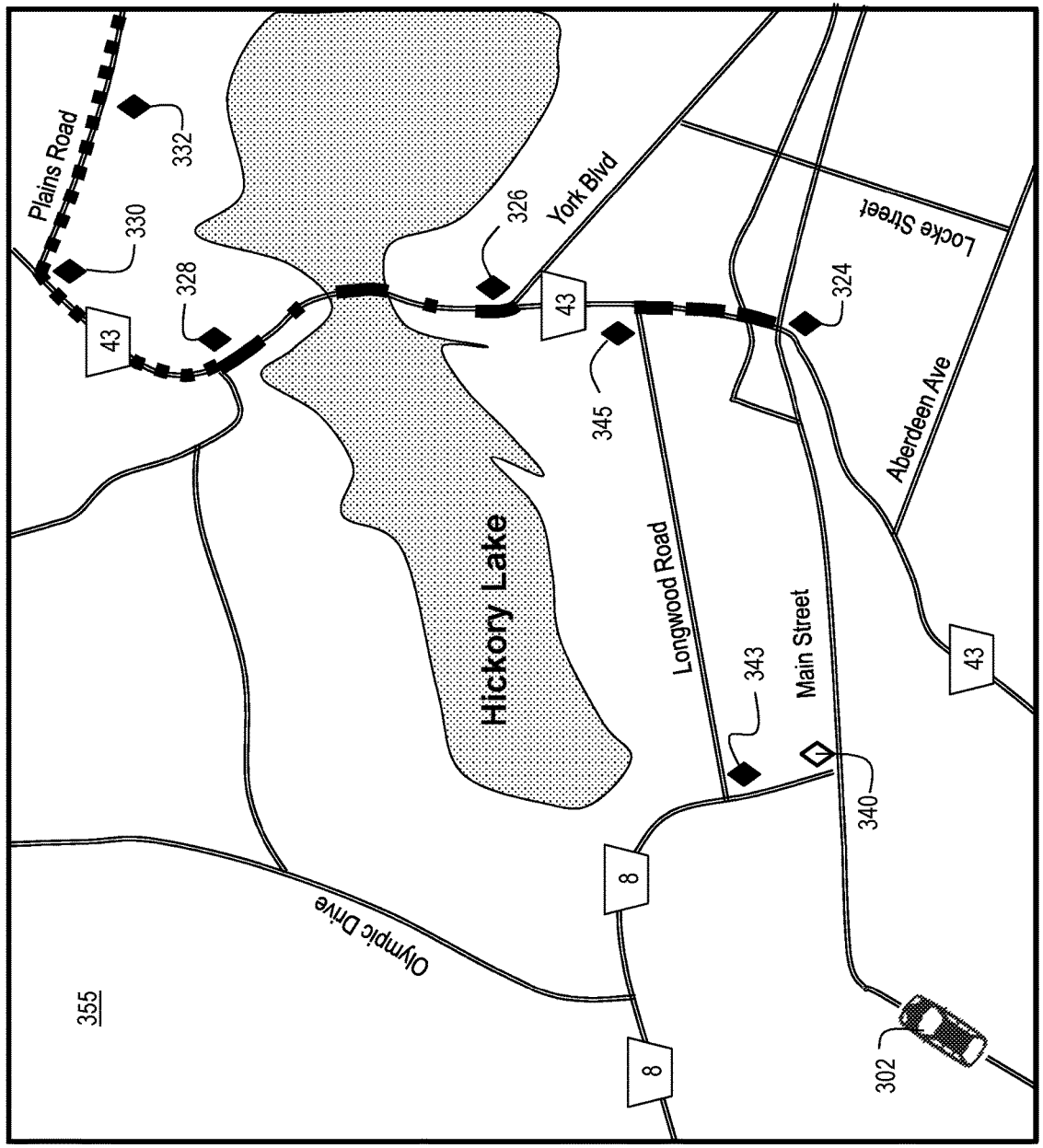
FIG. 3F shows composite data from three past-travel data sets.

FIG. 3F shows map 355 with composite data from the three past-travel data sets. Data is shown for the segments for which past-travel data exists. The segment between diamonds 324 and 326 is shown as a dashed line as data exists for it in the second past travel data set. The segment between diamonds 326 and 328 is shown as a dashed-dotted line as data exists for it in the third past travel data set. The segments between diamonds 328 and 330, and between diamonds 330 and 332, are shown in dotted lines because data exists for them in the third past travel data set. A past-travel fragment does not exist for the segment between diamonds 340 and 324. However, a similar fragment does exist between diamonds 343 and 345. That similar fragment can be used as a proxy segment. Diamond 340 indicates an intersection for which no past-travel data exists. In embodiments, data from a nearby intersection that has past-travel data may be used for the intersection that does not have any past-travel data. As an example, past-travel data exists for the intersection denoted by diamond 343. Accordingly, its data can be used as an estimate for traffic at the intersection denoted by diamond 340. This data can be combined with the other segments to create the simulated travel route.

Figure 4A:
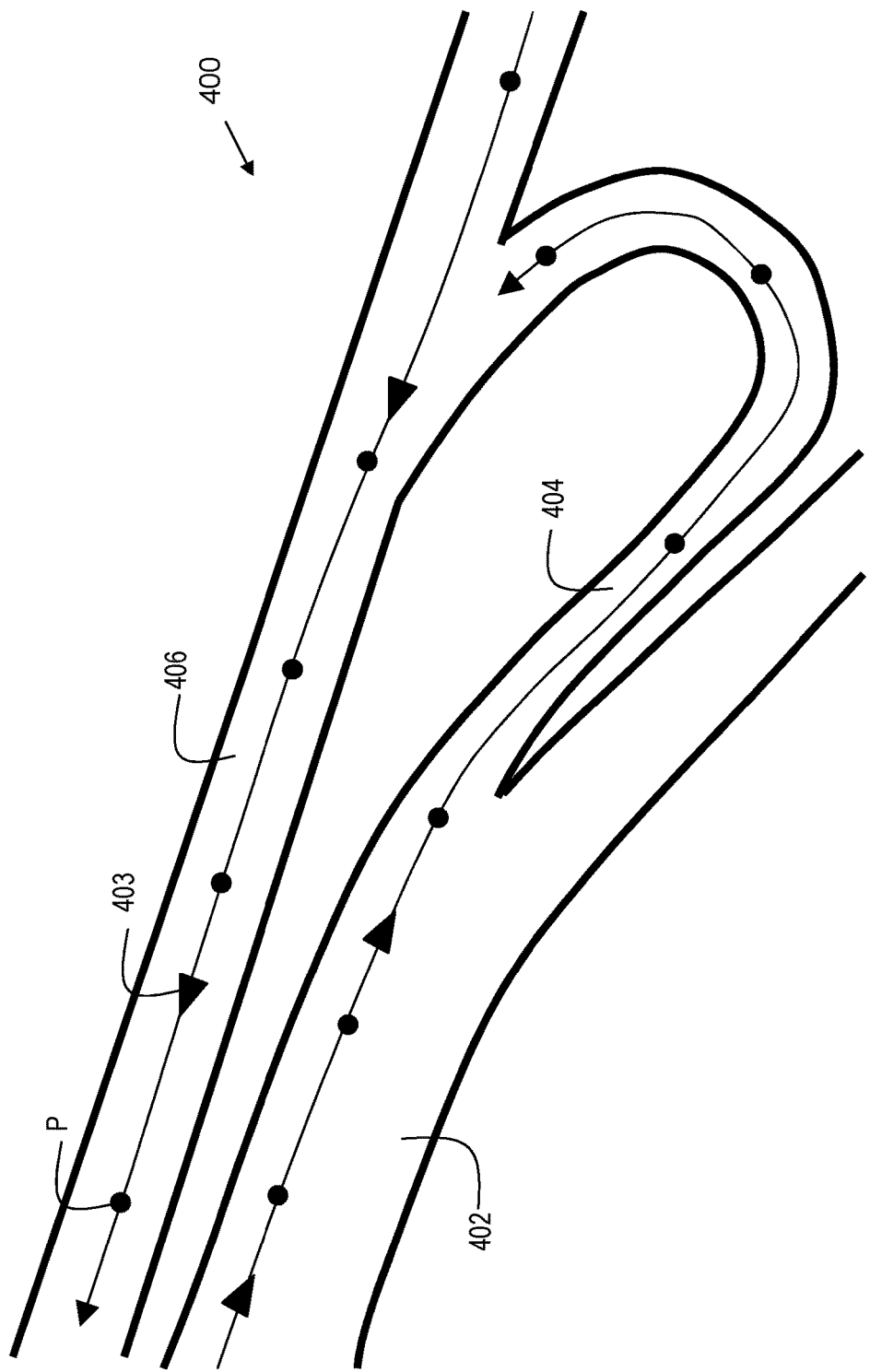
FIG. 4A shows an example route for generating a wrong-way simulation data set.

FIG. 4A shows a map 400 indicating an example route for generating a wrong-way simulation data set. In the example, a simulation of traffic going in the wrong (or opposite) direction is created. At 402, there is a first highway, and at 406, there is a second highway. At 404, there is an off-ramp from the first highway 402 to the second highway 406. Arrows, an example of which is pointed out at 403, indicate proper travel direction on each road. Circles, an example pointed out as "P," represent data points where data collected by a vehicle data logging device have occurred.

Figure 4B:
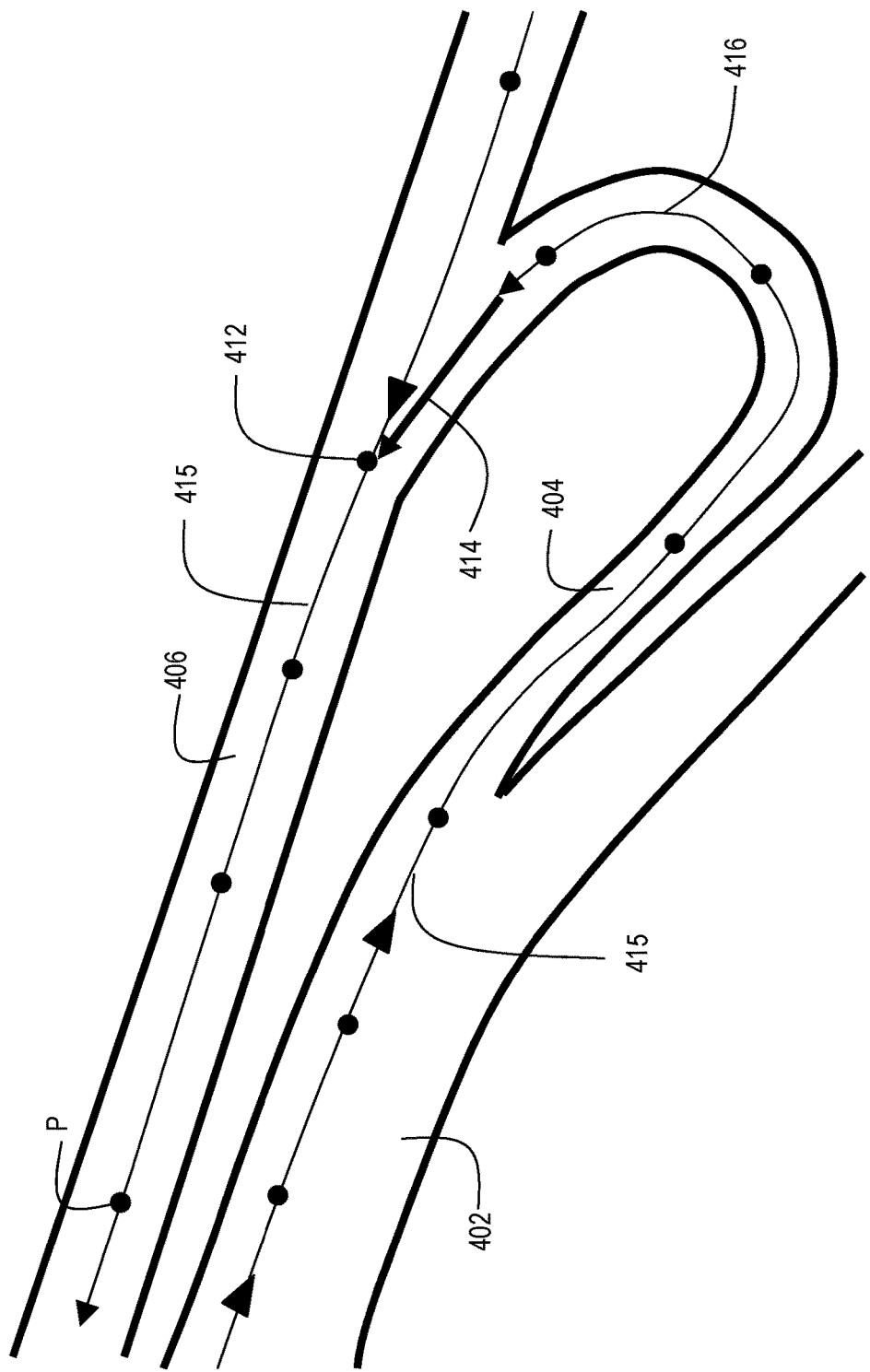
FIG. 4B illustrates connecting of travel paths.

FIG. 4B illustrates connecting of travel paths. This shows the connecting of travel paths in the vicinity of an intersection. Two travel paths are shown. First travel path 415 extends along the first highway 402 onto the ramp 404. Second travel path 416 travels along the second highway. Interpolation path 414 represents the path of the shortest distance from a data point of the first travel path 415 and a data point of the second travel path 416 as based on a forward direction of travel.

Figure 4C:
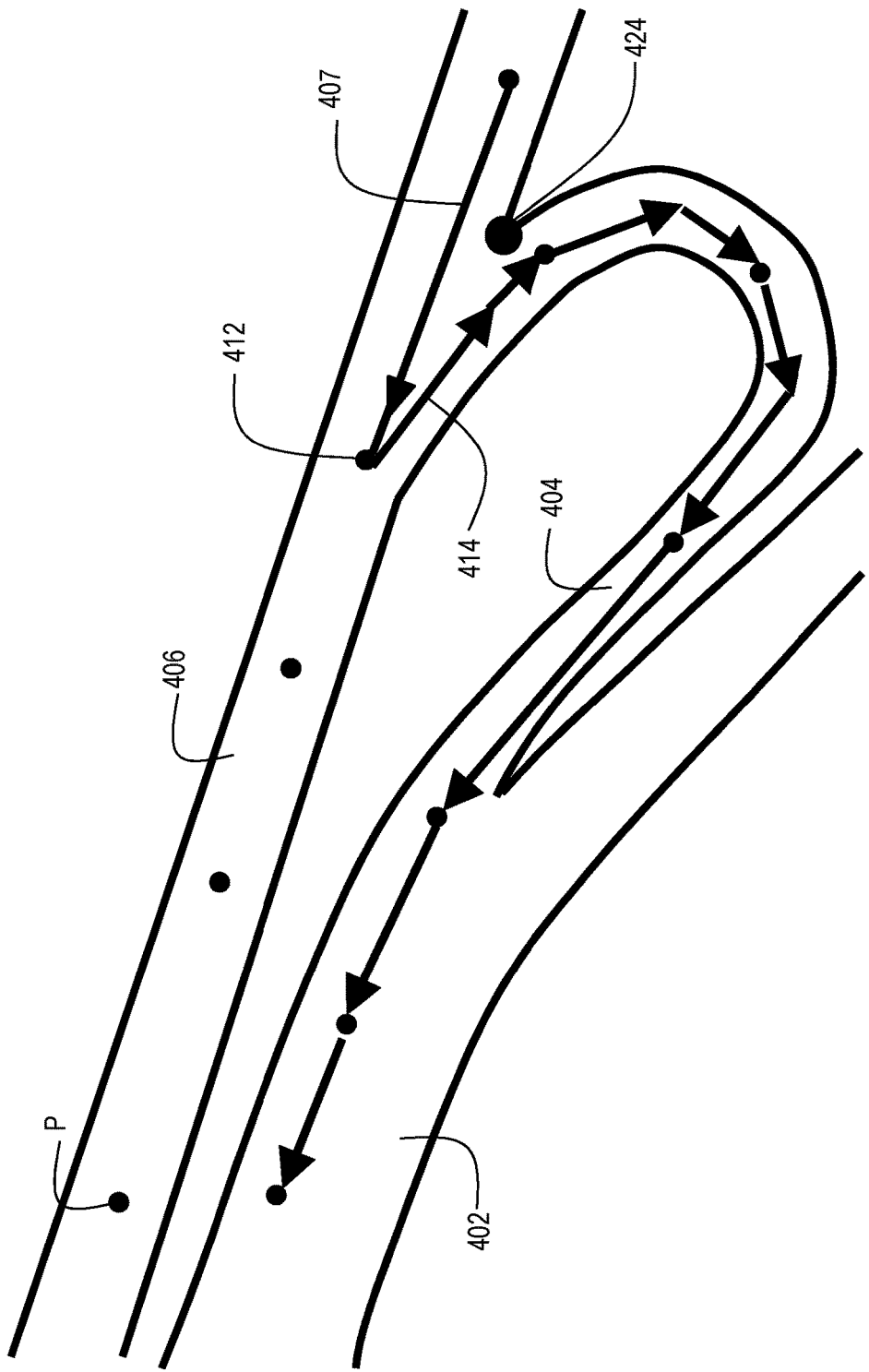
FIG. 4C illustrates wrong-way simulation data.

FIG. 4C illustrates wrong-way simulation data. Embodiments can further include performing a reverse playback of the simulation data set for the travel route to generate a wrong-way simulation data set. Arrows from data point to data point indicate a reverse playback of the travel data. The arrows connect data point to data point. It starts with arrow 407, which extends from the first highway 406 to data point 412, and then to path 414 continuing onto ramp 404, and then to second highway 402. The arrows are pointing in the opposite direction as in FIG. 4B since a simulation of wrong way data is shown. Point 424 represents an intrusion point. This is a physical point at which two roads join.

Figure 4D:
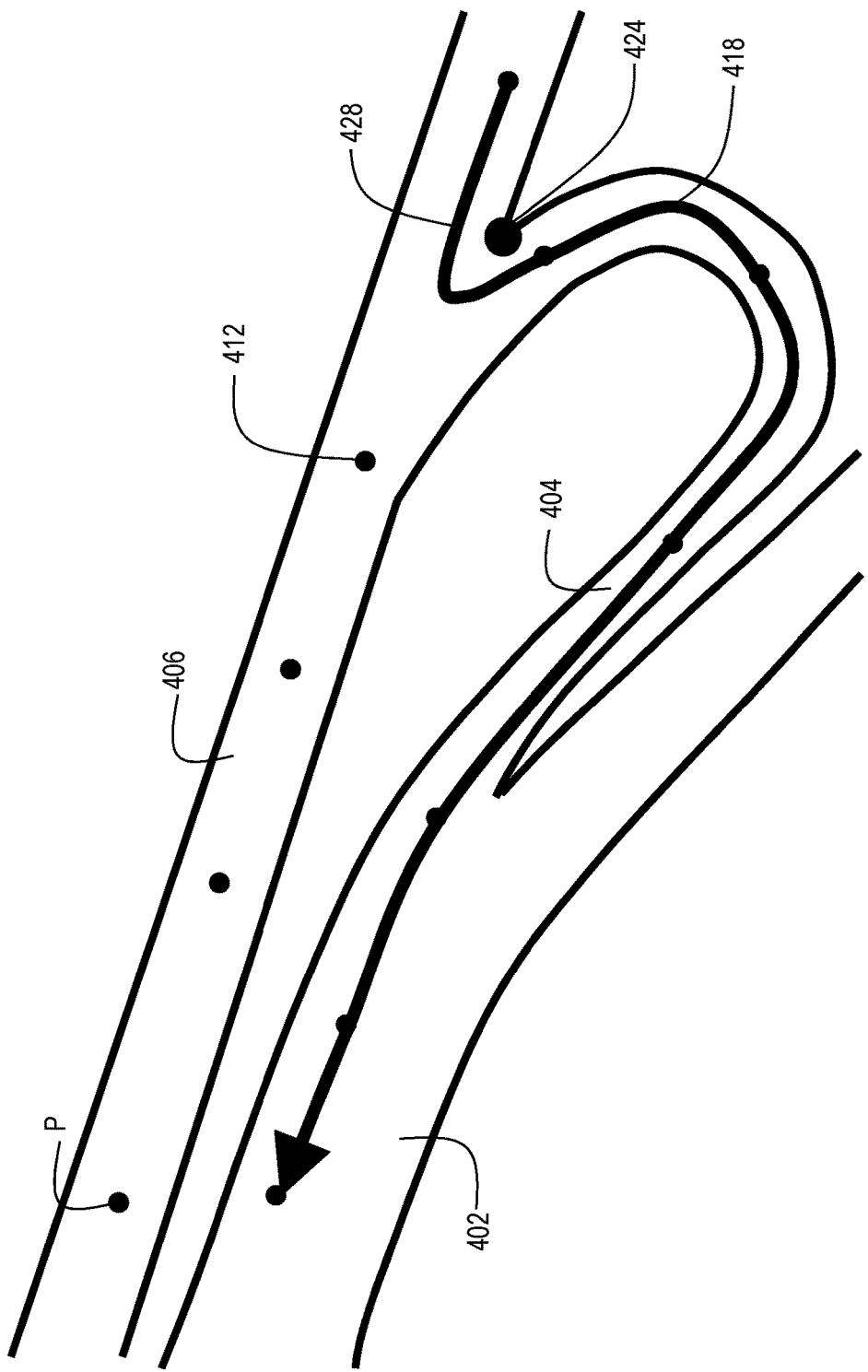
FIG. 4D illustrates an interpolated wrong-way simulation data set.

FIG. 4D illustrates an interpolated wrong-way simulation data set. Embodiments can further include performing an intrusion path analysis and performing a route interpolation on the wrong-way simulation data set, based on the intrusion path analysis, to create an interpolated wrong-way simulation data set. The individual arrows of FIG. 4C are formed into a single arrow 418 to show the simulated wrong-way route. At 428, the path is smoothed around point 424 for a more realistic path for the simulation. In the example, a data point 412 was removed from the data set in order to achieve this.

Figure 5:
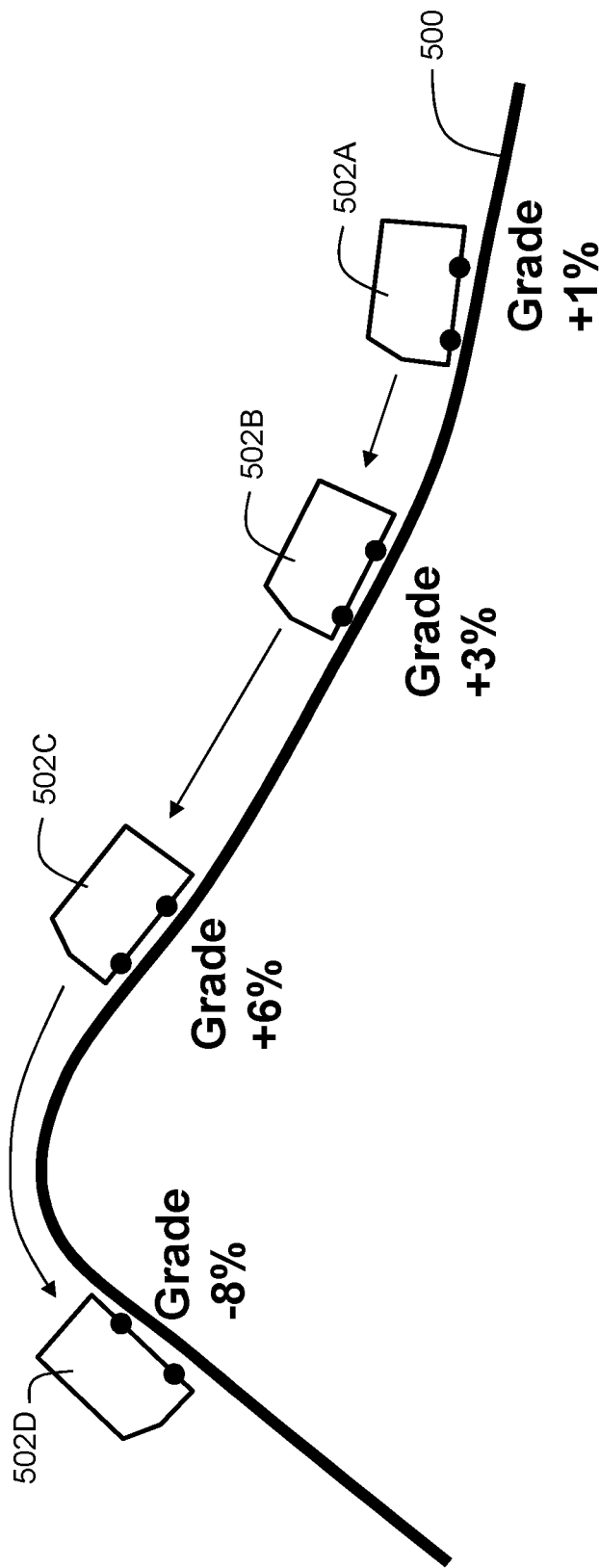
FIG. 5 illustrates a scenario for topographical compensation.

FIG. 5 illustrates a scenario for topographical compensation. Embodiments can further include performing a topographical compensation on the wrong-way simulation data set to create a topographically compensated wrong-way simulation data set. In other words, this takes topographical data into account in the simulation. For example, as a vehicle goes up a hill, the grade of the hill may increase. The grade information for the hill may be included in the analysis for creating the wrong-way simulation. In such a case, the grade for going uphill may be negated to account for going downhill when simulating the wrong way direction path.

In the example of FIG. 5, there is shown a vehicle going in the right-way direction on hill 500. Initially, the vehicle traverses the hill's grade of +1% at 502A. The vehicle continues on to traverse the hill's grade of +3% at 502B. The vehicle yet further traverses to the top of the hill passing through a grade of +6% at 502C. Finally, the vehicle traverses a grade of −8% at 502D on the way down the hill. In the right way, near the top of the hill, the grade is +6%. Accordingly, when travelling the wrong way, the grade would be −6%. This information can be used to compute a speed differential for the wrong-way data simulation. In the example, the flip of grades may cause a vehicle to move more slowly in the reverse direction since it must climb a steeper hill on the way up. The vehicle may also move more quickly on the way down the other side of the hill since the grade is less steep than in the right-way direction.

Figure 6:
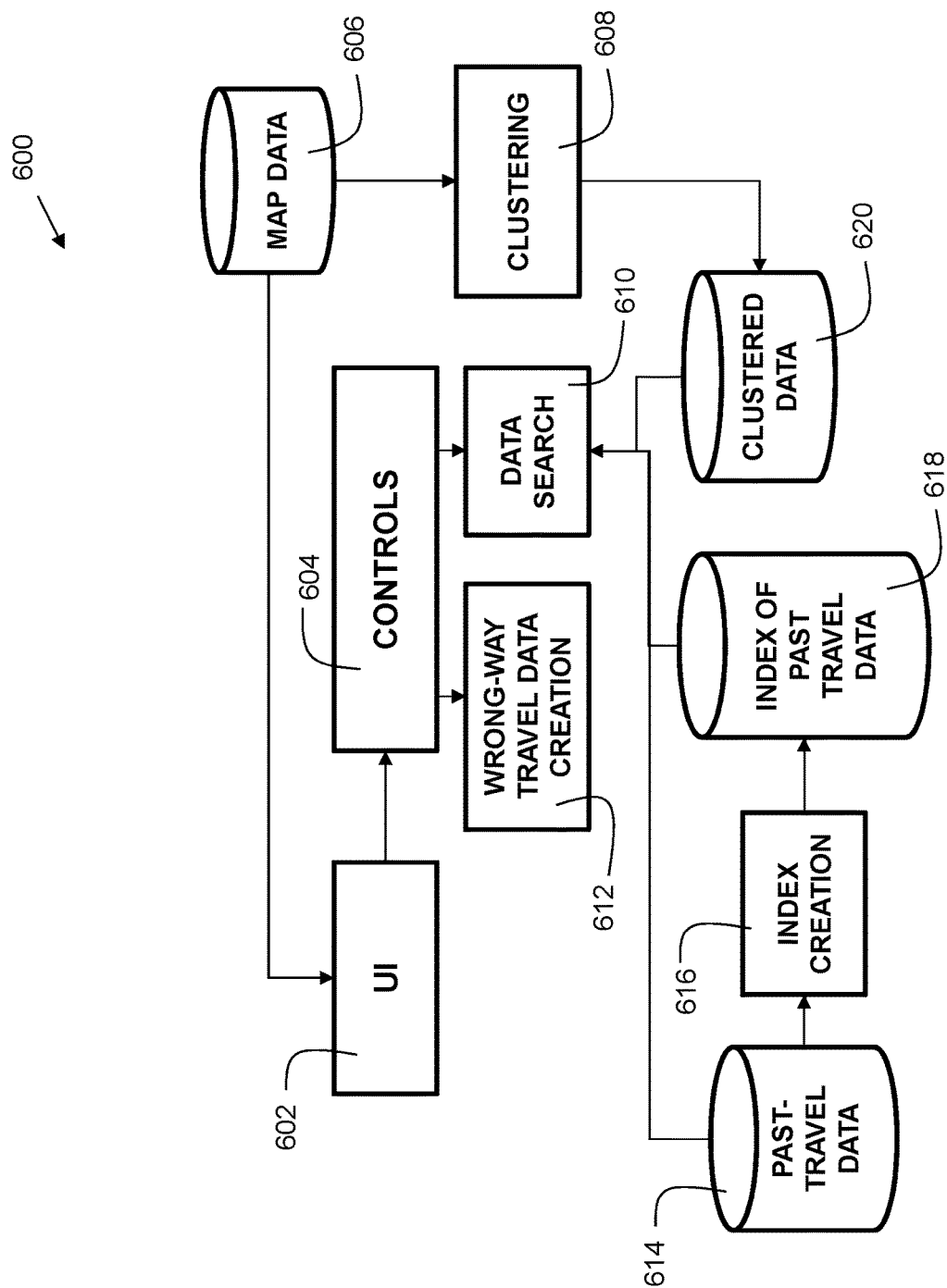
FIG. 6 is a block diagram showing modules used in embodiments of the present invention.

FIG. 6 is a block diagram 600 showing modules used in embodiments of the present invention. A user interface is shown at 602. This may include a screen, keyboard, mouse, or other item for allowing a user to interact with the system. At 604, there is shown controls. Controls may allow the user to create a simulation, such as wrong way data at 612 or search data at 610. Accordingly, at 612, there is shown wrong way data creation based on past-travel data. Storage units 606 holds map data. Storage unit 614 stores past-travel data. At 616, an index of the past-travel data is created for easy storage and access of the data. Storage unit 618 stores the index of past-travel data. Storage unit 620 stores clustered data, gathered from clustering at 608. For situations where there is an intersection or segment for which no sufficient past-travel data is available, a cluster of intersections having configurations similar to the intersection may be created in advance, and data of an intersection in the cluster for which sufficient data is available is used to populate data for the intersection with no directly corresponding past-travel data. The clustered data is stored in storage unit 620.

Figure 7:
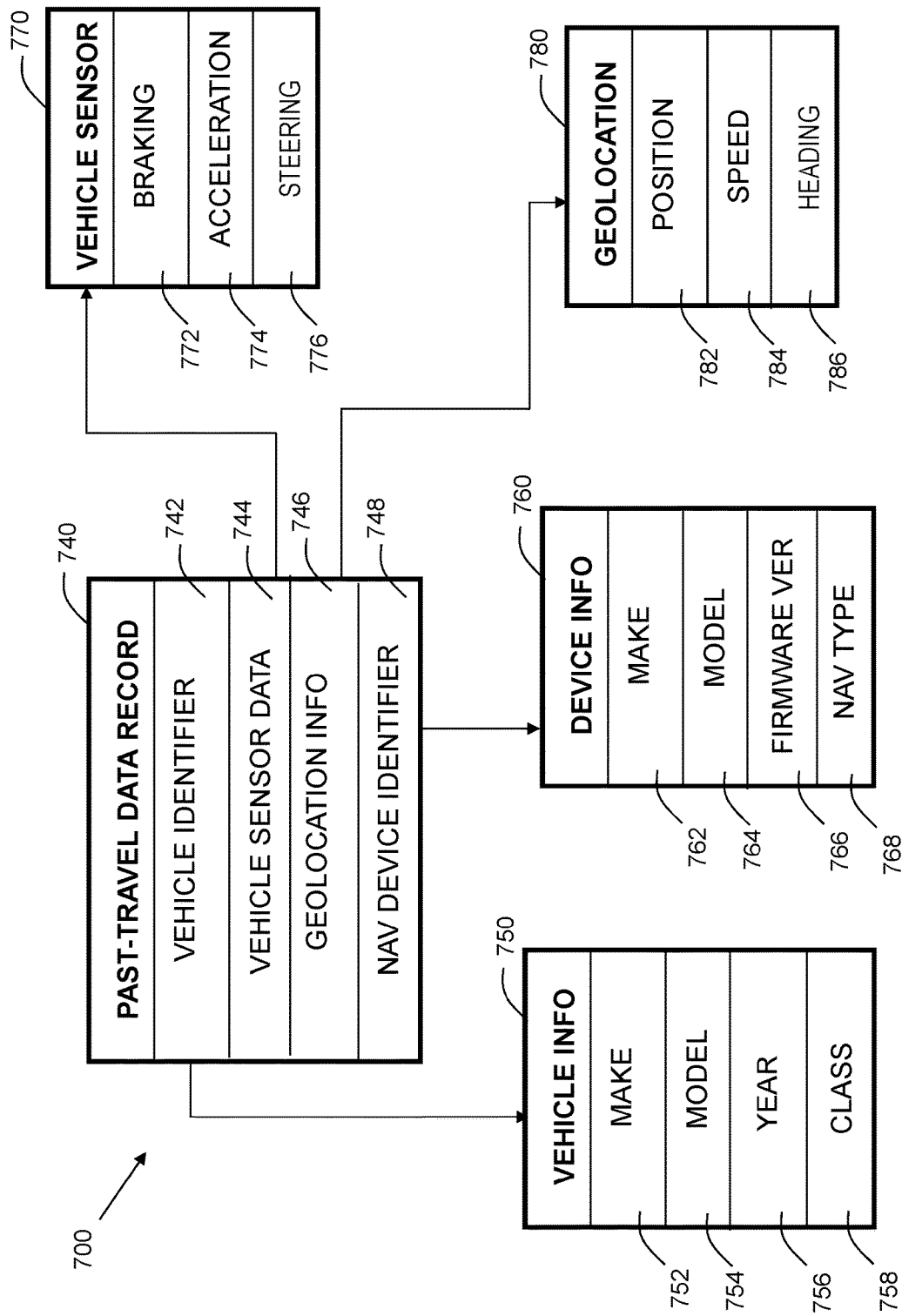
FIG. 7 shows a data structure for past-travel information in accordance with embodiments of the present invention.

FIG. 7 shows a data structure 700 for past-travel information in accordance with embodiments of the present invention. Five example data tables are shown in a relational database. It should be recognized that the data tables and fields are examples, and in embodiments, any suitable data tables, database, and fields may be included.

Table 740 includes data related to an exemplary past-travel data record. Field 742 includes a vehicle identifier. This is an alphanumeric or symbolic code which is unique to a particular vehicle. In an example, it could be a VIN. Field 744 includes vehicle sensor data. The data may be captured from a speed sensor such as 212 described in FIG. 2. Field 746 includes geolocation information. This data may be captured from a geolocation receiver such as 208 of FIG. 2. Field 748 includes a navigation device identifier. This is an alphanumeric or symbolic code which is unique to a particular navigation device.

Table 750 includes data related to vehicle information. Field 752 includes vehicle make. This is the brand/company that makes the vehicle (e.g., Honda). Field 754 includes the vehicle model (e.g., Civic). Field 756 includes a vehicle year. This is the model year of the vehicle. Field 758 includes a vehicle class. Vehicle class is the type of vehicle, such as sedan, van, sport utility vehicle, truck, etc.

Table 760 includes data related to the navigation device. Field 762 includes the make of the device. This is the manufacturer/brand of the device. Field 764 includes the model of the device. Field 766 includes the firmware version for the navigation device. Field 768 includes the navigation type. The navigation type can include, but is not limited to, standalone (e.g. a dedicated navigation device such as a Garmin® or TomTom® device), smartphone (e.g., a device built with a built-in navigation receiver (e.g., GPS)), and/or mobile hotspot (pocket WiFi).

Table 770 includes data related to vehicle sensors. Field 772 includes captured braking events from when the vehicle travels. For example, unusually quick braking may be detected. Field 774 includes captured acceleration events. For example, rapid acceleration events may be detected. Field 776 includes captured steering events. For example, a fast change of direction may be detected. This information may be acquired from the speed sensor 212 and/or vehicle data interface 217 shown in FIG. 2. Other behaviors can be included in table 770. These behaviors can include, but are not limited to, speeding (travelling at speeds in excess of posted speed limits), frequent acceleration, frequent braking, excessive speed in a curve, acceleration before a curve, over-braking before exiting a curve, and/or harsh steering. In embodiments, a driver behavior analysis record includes an indication selected from the group consisting of, a rapid acceleration indication, a harsh steering indication, a curve over-braking indication, and a speeding indication. The rapid acceleration indication can be classified as an indication of a change in speed that exceeds a predetermined threshold over a given time duration. The harsh steering indication can be classified as an indication of a number of steering adjustments that exceeds a predetermined threshold over a given time duration. The curve over-braking indication can be classified as an indication of a number of hard and/or long braking instances that exceeds a predetermined threshold over a given time duration while the steering angle exceeds a predetermined number of degrees. Other driver behaviors may also be included in embodiments of the present invention.

Table 780 includes data related to geolocation. Field 782 includes position. Field 784 includes speed. Field 786 includes heading. This stores direction for paths traveled. In embodiments, the direction may be stored as a heading ranging from 0 to 359 degrees.

Figure 8:
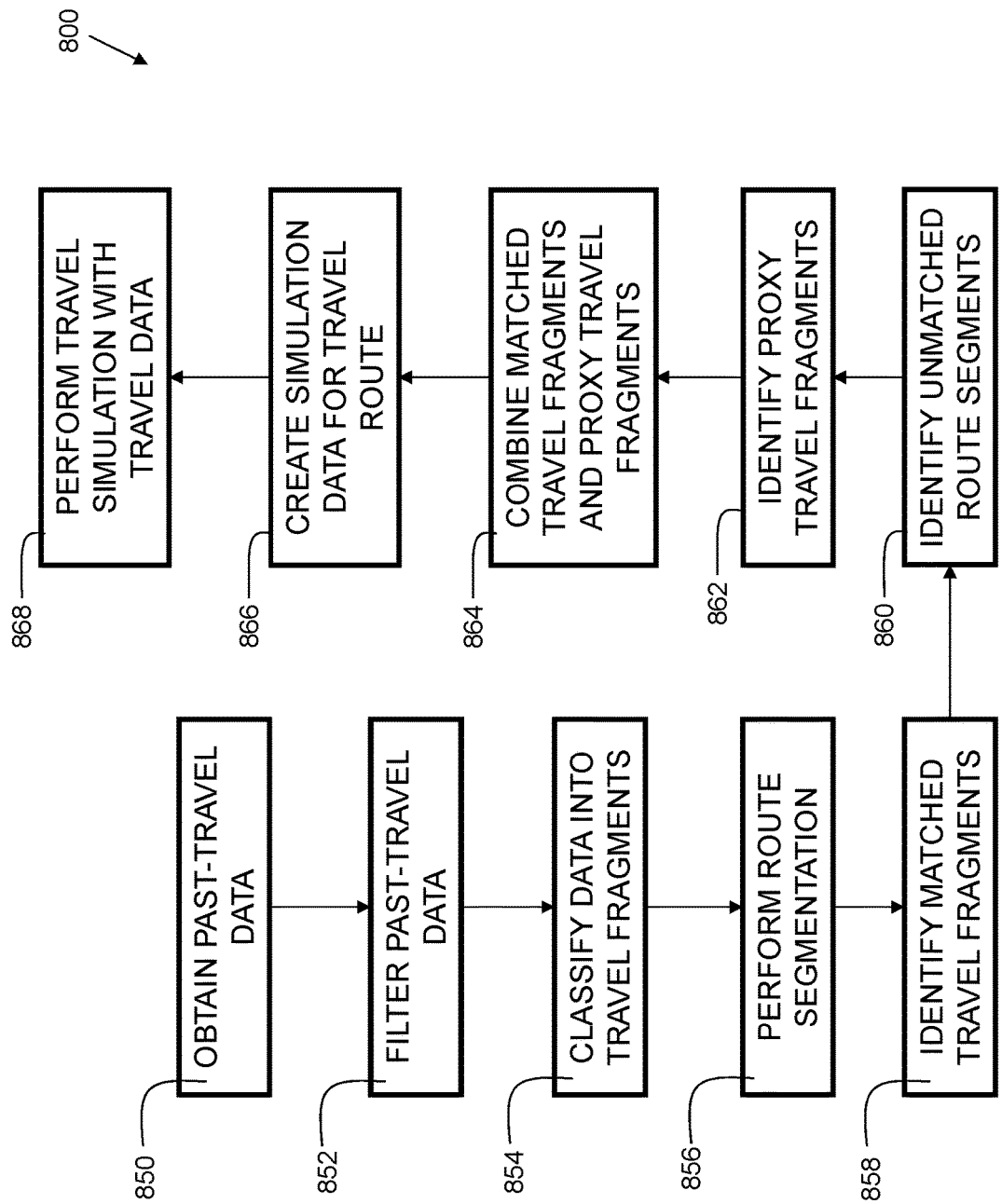
FIG. 8 is a flowchart showing process steps for embodiments of the present invention.

FIG. 8 is a flowchart 800 showing process steps for embodiments of the present invention. At 850, past travel data is obtained. In embodiments, obtaining the past-travel data includes obtaining geolocation data. Obtaining the past-travel data may include obtaining a navigation device type. Obtaining the past-travel data may include obtaining a vehicle model. Obtaining the past-travel data may include obtaining a driver behavior analysis record, which may be derived from vehicle sensor data. In some embodiments, the driver behavior analysis record includes a harsh braking indication. In some embodiments, the driver behavior analysis record includes a rapid acceleration indication.

At 852, the past travel data is filtered. In some embodiments, the filtering is based on road type. For example, side roads may be filtered out, leaving only highways, or vice versa. In some embodiments, the filtering is based on vehicle class prior to classifying the past-travel data into a plurality of travel fragments. For example, a particular type of vehicle may traverse a hilly road more efficiently. For example, an 8-cylinder engine truck may be more efficient in traversing treacherous terrain than a 4-cylinder engine sedan. In some embodiments, the filtering can also include other metadata beyond the road and vehicle information. In some embodiments, the filtering can include traffic conditions such as congestion, average traffic speed, and/or standard deviation of traffic speed (to provide a measure of "stop-go" traffic conditions). Some embodiments may further include filtering on weather conditions that occurred during the collection of the data. In embodiments, the weather conditions can include, but are not limited to, temperature, wind, rain, snow, humidity, cloud cover, and/or other weather conditions. In embodiments, this data is obtained by correlating the time and location of past-travel data with weather conditions from weather data 158 (FIG. 1). Embodiments can include further comprising filtering past-travel data based on traffic conditions and weather conditions prior to classifying the past-travel data into a plurality of travel fragments.

At 854, data is classified into travel fragments. A travel fragment is a portion of a past-travel trip that may be used to create a simulation.

At 856, route segmentation is performed. This is where the route is segmented according to data points. At 858, matched travel fragments are identified. These are travel fragments available in the system that align with the trip that is to be simulated. At 860, unmatched travel fragments are identified. These are portions of the trip to be simulated for which past-travel information is not available in the system. At 862, proxy travel fragments are identified. These are past-travel fragments that are not on the travel route to be simulated, but are still similar to the travel route to be simulated. These can be used in the simulation to "fill in blanks" where there are unmatched travel fragments.

At 864, matched travel fragments and proxy travel fragments are combined for simulation purposes. At 866, simulation data is created for the travel route. At 868, travel simulation is performed with the travel data. This creates a simulated travel route where one might not exist. For example, it is unlikely that a city would do a study to determine characteristics of travel if directionality were reversed. This could be dangerous, difficult to obtain (as roads would have to be shut down to safely collect such data), and expensive. Thus, reversing past-travel data to approximate the wrong-way travel data can provide meaningful results without the aforementioned disadvantages.

As can now be appreciated, disclosed embodiments provide improvements to the technical field of transportation planning and analysis. Past-travel data is classified into patterns each having natural variations due to factors such as navigation system errors, vehicle types, or the like, and the classified data is stored. For a vehicle type and a given travel route to be simulated, the travel route is segmented based on intersections, or the like. Past-travel data on the segmented route is searched, and pieces of found past-travel data are combined with one another and smoothed at the vicinities of points on which the composition has been performed, to generate simulation data that is based on actual driver data.

For situations where there is an intersection or segment for which no sufficient past-travel data is available, a cluster of intersections having configurations similar to the intersection may be created in advance, and data of an intersection in the cluster for which sufficient data is available is used to populate data for the intersection with no directly corresponding past-travel data.

For wrong-way travel data, pieces of past normal travel data are combined, connected, and partially played back in reverse order, to thereby generate wrong-way travel data. To accommodate cases in which normal travel data has been created with a sampling rate different from that of a case in which wrong-way travel is sampled, the normal travel data is interpolated, taking error distribution of normal travel data into account. This allows a new level of realistic simulation for wrong-way travel. This is important for various types of traffic analysis, and there is a limited amount of actual wrong-way travel data available, due to the dangerous nature of performing wrong-way travel to collect such data. Disclosed embodiments enable actual driver-generated vehicle data for wrong-way travel. This data can be used as input to various traffic simulations and studies to provide useful information to improve driver and/or pedestrian safety.

Some of the functional components described in this specification have been labeled as systems or units in order to more particularly emphasize their implementation independence. For example, a system or unit may be implemented as a hardware circuit comprising custom VLSI circuits or gate arrays, off-the-shelf semiconductors such as logic chips, transistors, or other discrete components. A system or unit may also be implemented in programmable hardware devices such as field programmable gate arrays, programmable array logic, programmable logic devices, or the like. A system or unit may also be implemented in software for execution by various types of processors. A system or unit or component of executable code may, for instance, comprise one or more physical or logical blocks of computer instructions, which may, for instance, be organized as an object, procedure, or function. Nevertheless, the executables of an identified system or unit need not be physically located together, but may comprise disparate instructions stored in different locations which, when joined logically together, comprise the system or unit and achieve the stated purpose for the system or unit.

Further, a system or unit of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices and disparate memory devices.

Furthermore, systems/units may also be implemented as a combination of software and one or more hardware devices. For instance, location determination and alert message and/or coupon rendering may be embodied in the combination of a software executable code stored on a memory medium (e.g., memory storage device). In a further example, a system or unit may be the combination of a processor that operates on a set of operational data.

As noted above, some of the embodiments may be embodied in hardware. The hardware may be referenced as a hardware element. In general, a hardware element may refer to any hardware structures arranged to perform certain operations. In one embodiment, for example, the hardware elements may include any analog or digital electrical or electronic elements fabricated on a substrate. The fabrication may be performed using silicon-based integrated circuit (IC) techniques, such as complementary metal oxide semiconductor (CMOS), bipolar, and bipolar CMOS (BiCMOS) techniques, for example. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor devices, chips, microchips, chip sets, and so forth. However, the embodiments are not limited in this context.

Also noted above, some embodiments may be embodied in software. The software may be referenced as a software element. In general, a software element may refer to any software structures arranged to perform certain operations. In one embodiment, for example, the software elements may include program instructions and/or data adapted for execution by a hardware element, such as a processor. Program instructions may include an organized list of commands comprising words, values, or symbols arranged in a predetermined syntax that, when executed, may cause a processor to perform a corresponding set of operations.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, may be non-transitory, and thus is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Program data may also be received via the network adapter or network interface.

Computer readable program instructions for carrying out operations of embodiments of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of embodiments of the present invention.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

While the disclosure outlines exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with embodiments of the present invention. Furthermore, the methods according to embodiments of the present invention may be implemented in association with the formation and/or processing of structures illustrated and described herein as well as in association with other structures not illustrated. Moreover, in particular regard to the various functions performed by the above described components (assemblies, devices, circuits, etc.), the terms used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of embodiments of the invention may have been disclosed with respect to only one of several embodiments, such feature may be combined with one or more features of the other embodiments as may be desired and advantageous for any given or particular application. Therefore, it is to be understood that the appended claims are intended to cover all such modifications and changes that fall within the true spirit of embodiments of the invention.

What is claimed is:

1. A computer-implemented method for generating travel data for simulation of a travel route, comprising the steps of:
   obtaining past-travel data of vehicles;
   classifying the past-travel data into a plurality of travel fragments, the travel fragments being data readings from sections of paths historically traveled by one or more of the vehicles;
   performing segmentation on the travel route to be simulated to obtain a plurality of route segments corresponding to the travel route, the route segments being sections of the travel route to be simulated;
   identifying travel fragments that match route segments from the plurality of route segments;
   identifying unmatched route segments from the plurality of route segments that do not match any travel fragment;
   identifying proxy travel fragments that correspond to one or more of the identified unmatched route segments, identifying each proxy travel fragment comprising:
      selecting from the plurality of travel fragments a travel fragment that does not overlay a particular one of the unmatched route segments, but has characteristics that allow the selected travel fragment to serve as a substitute for a missing travel fragment that would match that particular unmatched route segment;
   combining the matched travel fragments and the proxy travel fragments to create a simulation data set for the travel route;
   performing a reverse playback of the simulation data set for the travel route to generate a wrong-way simulation data set;
   performing a topographical compensation on the wrong-way simulation data set to create a topographically compensated wrong-way simulation data set; and
   determining a safety implication of a change in a condition on the travel route based on the simulation data set and the wrong-way simulation data set.

2. The method of claim 1, further comprising filtering past-travel data based on road type prior to classifying the past-travel data into a plurality of travel fragments.

3. The method of claim 1, wherein obtaining the past-travel data includes obtaining geolocation data.

4. The method of claim 1, wherein obtaining the past-travel data includes obtaining a navigation device type.

5. The method of claim 1, wherein obtaining the past-travel data includes obtaining a vehicle model.

6. The method of claim 1, further comprising filtering past-travel data based on vehicle class prior to classifying the past-travel data into a plurality of travel fragments.

7. The method of claim 1, wherein the characteristics comprise at least one feature selected from the group consisting of: a geographic proximity to the unmatched route segment, approximately a same length as the unmatched route segment, and endpoints in proximity to endpoints of the unmatched route segment.

8. The method of claim 1, further comprising filtering past-travel data based on traffic conditions and weather conditions prior to classifying the past-travel data into a plurality of travel fragments.

9. The method of claim 1, wherein obtaining the past-travel data includes obtaining a driver behavior analysis record, and wherein the driver behavior analysis record includes an indication selected from the group consisting of, a harsh braking indication, a rapid acceleration indication, a harsh steering indication, a curve over-braking indication, and a speeding indication.

10. The method of claim 1, further comprising:
    performing an intrusion path analysis, and:
    performing a route interpolation on the wrong-way simulation data set, based on the intrusion path analysis, to create an interpolated wrong-way simulation data set.

11. An electronic computing device comprising:
    a processor;
    a memory coupled to the processor, the memory containing instructions, that when executed by the processor, perform the steps of:
    obtaining past-travel data of vehicles;
    classifying the past-travel data into a plurality of travel fragments, the travel fragments being data readings from sections of paths historically traveled by one or more of the vehicles;
    performing segmentation on the travel route to be simulated to obtain a plurality of route segments corresponding to a travel route, the route segments being sections of the travel route to be simulated;
    identifying travel fragments that match route segments from the plurality of route segments;
    identifying unmatched route segments from the plurality of route segments that do not match any travel fragment;
    identifying proxy travel fragments that correspond to one or more of the identified unmatched route segments, identifying each proxy travel fragment comprising:
       selecting from the plurality of travel fragments a travel fragment that does not overlay a particular one of the unmatched route segments, but has characteristics that allow the selected travel fragment to serve as a substitute for a missing travel fragment that would match that particular unmatched route segment;
    combining the matched travel fragments and the proxy travel fragments to create a simulation data set for the travel route;
    performing a reverse playback of the simulation data set for the travel route to generate a wrong-way simulation data set;
    performing a topographical compensation on the wrong-way simulation data set to create a topographically compensated wrong-way simulation data set; and
    determining a safety implication of a change in a condition on the travel route based on the simulation data set and the wrong-way simulation data set.

12. The electronic computing device of claim 11, wherein the memory further comprises instructions, that when executed by the processor, perform the step of filtering past-travel data based on vehicle class prior to classifying the past-travel data into a plurality of travel fragments.

13. The electronic computing device of claim 11, wherein the memory further comprises instructions, that when executed by the processor, perform the step of performing an intrusion path analysis, and:
    performing a route interpolation on the wrong-way simulation data set, based on the intrusion path analysis, to create an interpolated wrong-way simulation data set.

14. A computer program product for an electronic computing device comprising a non-transitory computer readable storage medium having program instructions embodied therewith, the program instructions executable by a processor to cause the electronic computing device to:
    obtain past-travel data of vehicles;

classify the past-travel data into a plurality of travel fragments, the travel fragments being data readings from sections of paths historically traveled by one or more of the vehicles;
perform segmentation on the travel route to be simulated to obtain a plurality of route segments corresponding to a travel route, the route segments being sections of the travel route to be simulated;
identify travel fragments that match route segments from the plurality of route segments;
identify unmatched route segments from the plurality of route segments that do not match any travel fragment;
identify proxy travel fragments that correspond to one or more of the identified unmatched route segments, the identifying each proxy travel fragment further comprising:
  selecting from the plurality of travel fragments a travel fragment that does not overlay a particular one of the unmatched route segments, but has characteristics that allow the selected travel fragment to serve as a substitute for a missing travel fragment that would match that particular unmatched route segment;
combine the matched travel fragments and the proxy travel fragments to create a simulation data set for the travel route;
perform a reverse playback of the simulation data set for the travel route to generate a wrong-way simulation data set;
perform a topographical compensation on the wrong-way simulation data set to create a topographically compensated wrong-way simulation data set; and
determine a safety implication of a change in a condition on the travel route based on the simulation data set and the wrong-way simulation data set.

15. The computer program product of claim 14, wherein the non-transitory computer readable storage medium includes program instructions executable by the processor to cause the electronic computing device to:
perform an intrusion path analysis, and:
perform a route interpolation on the wrong-way simulation data set, based on the intrusion path analysis, to create an interpolated wrong-way simulation data set.

* * * * *